United States Patent [19]

Grant

[11] Patent Number: 4,789,023
[45] Date of Patent: Dec. 6, 1988

[54] VIBRATION ISOLATING HEAT SINK

[76] Inventor: Frederic F. Grant, 14505 Eastbrook Ave., Bellflower, Calif. 90706

[21] Appl. No.: 78,820

[22] Filed: Jul. 28, 1987

[51] Int. Cl.[4] .............................................. F28D 15/02
[52] U.S. Cl. ........................................ 165/1; 165/41; 165/47; 165/69; 165/104.26; 248/562; 248/610; 248/DIG. 1; 248/581; 248/619; 248/634; 361/385
[58] Field of Search ...................... 165/47, 41, 104.26, 165/69, 1; 248/610, 562, DIG. 1, 619, 632, 634, 581; 361/385

[56] References Cited

U.S. PATENT DOCUMENTS

| | | |
|---|---|---|
| 2,958,021 | 10/1960 | Cornelison et al. . |
| 3,847,208 | 11/1974 | Ollendorf ............................ 165/47 |
| 3,957,107 | 5/1976 | Altoz et al. . |
| 4,000,776 | 1/1977 | Kroebig et al. . |
| 4,077,518 | 3/1978 | Kisslinger et al. ................. 248/610 |
| 4,118,756 | 10/1978 | Nelson et al. . |
| 4,212,349 | 7/1980 | Andros et al. . |
| 4,313,492 | 2/1982 | Andros et al. . |
| 4,402,358 | 9/1983 | Wolf . |
| 4,549,602 | 10/1985 | Espinoza ............................ 165/69 |
| 4,631,635 | 12/1986 | Dolbeare ............................ 165/69 |

FOREIGN PATENT DOCUMENTS 950981  8/1982  U.S.S.R. .............................. 165/69

OTHER PUBLICATIONS

G. Yale Eastman, "The Heat Pipe," Scientific American, vol. 218, May, 1968, pp. 38-46.

Primary Examiner—Albert W. Davis, Jr.
Attorney, Agent, or Firm—Benoit Law Corporation

[57] ABSTRACT

Methods and apparatus for transporting a heat-generating load through an environment affected by vibrations and pressure variations, employ a capillary structure for advancing that working fluid, when in a liquid state, from a condenser section at a heat-conducting supporting structure spaced from the load to an evaporator section at a heat-conducting load support at the load, for converting the advanced fluid to a vapor state with heat drawn from the load in the evaporator section. There is provided between the supporting structure and the load support a flexible enclosure encompassing around the capillary structure at least part of a space extending from the evaporator section back to the condenser section for returning the working fluid, when in its vapor state, in a heat-transfer cycle to the condenser section for reconversion to its liquid state upon removal of heat through the supporting structure and for reapplication of the working fluid in its liquid state through said capillary structure from the condenser section to the evaporator section for reevaporation thereat with more heat drawn from the load. Resilient means extended between the supporting structure and the load support are provided for effecting vibration damping of the load while removing heat therefrom in the evaporator section with the working fluid converting to its vapor state inside the flexible enclosure and the heat-transfer cycle in the flexible enclosure is protected against pressure variations occurring externally of that flexible enclosure.

50 Claims, 3 Drawing Sheets

VIBRATION ISOLATING HEAT SINK

BACKGROUND OF THE INVENTION

1. Field of the Invention

The subject invention generally relates to methods and apparatus for transporting heat-generating loads through environments affected by vibrations and substantial pressure variations and, more particularly, to vibration isolators that act as heat sinks, and to heat pipe systems with vibration damping or isolating functions.

2. Information Disclosure Statement

The following disclosure statement is made pursuant to the duty of disclosure imposed by law and formulated in 37 CFR 1.56(a). No representation is hereby made that information thus disclosed in fact constitutes prior art, inasmuch as 37 CFR 1.56(a) relies on a materiality concept which depends on uncertain and inevitably subjective elements of substantial likelihood and reasonableness and inasmuch as a growing attitude appears to require citation of material which might lead to a discovery of pertinent material though not necessarily being of itself pertinent. Also, the following comments contain conclusions and observations which have only been drawn or become apparent after conception of the subject invention or which contrast the subject invention or its merits against the background of developments which may be subsequent in time or priority.

Also, no preamble of any statement of invention or claim hereof is intended to represent that the content of that preamble is prior art, particularly where one or more recitations in a preamble serve the purpose of providing antecedents for the remainder of a statement of invention or claim.

In his article, "THE HEAT PIPE," G. Yale Eastman (SCIENTIFIC AMERICAN, vol. 218, May 1968), points out that even copper and other metals are poor conductors of heat, giving a numerical example for that fact. He then relates how the principle of the heat pipe was first put forward in 1942 by Richard S. Gaugler of the General Motors Corporation, and was rediscovered in 1963 by George M. Grover of the Los Alamos Scientific Laboratory.

In the meantime, with the advent of the transistor, ways and means were sought for cooling electronic equipment by establishing a liquid vaporization and recondensation cycle thereat, as may, for instance, be seen from U.S. Pat. No. 2,958,021, by B. Cornelison et al, issued Oct. 25, 1960, for Cooling Arrangement for Transistor. That proposal lacked the capillary element necessary for the heat pipe cycle. A subsequent proposal provided such a capillary element in the form of a flexible wick, as may be seen from U.S. Pat. No. 3,957,107, by F. Altoz et al, issued May 18, 1976, for a Thermal Switch.

In particular, that Altoz et al U.S. Pat. No. 3,957,107 teaches the use of conventional heat-insulating standoff support members for mounting what they call a "hot plate" on top of a "cold plate." The equipment that is temperature controlled is thermally attached to the hot plate. The cold plate may be the skin of an aircraft, the wall of a heat exchanger, or another heat sink. The heat pipe structure is located between the cold and hot plates, having a bottom plate attached to the cold plate and including an expansible bellows extending from that bottom plate and mounting a top plate in spaced relationship to the hot plate. The above mentioned capillary wick extends between these bottom and top plates inside the bellows, wherein the working fluid is contained.

In the thermal switch of that Altoz et al U.S. Pat. No. 3,957,107, the thermal impedence along the heat pipe and from the hot plate to the cold plate is very high. In fact, that heat pipe structure can only become operative if the cold plate becomes overheated. In that case, such excessive heat energy enters the heat pipe structure through its bottom plate until the working liquid starts to evaporate and expand the encompassing bellows. This moves the spaced top plate of the heat pipe structure toward and eventually into contact with the hot plate, whereby that thermal switch in effect closes to conduct heat away from the hot plate through the now expanded heat pipe structure to the cold plate. After the emergency condition has ceased, the heat pipe structure switches to its normal high impedance state.

Another kind of switching in a heat pipe system is disclosed in U.S. Pat. No. 4,000,776, by H. L. Kroebig et al, issued Jan. 4, 1977. In that case, the heat pipe wick is normally held in contact with a heat sink, for removing heat from a component inside a structure to the outside thereof. In order to prevent reverse flow of heat, the heat pipe structure is provided with a bellows that contains an expansible fluid. When the outside of the structure heats up, the bellows moves the wick away from the heat sink, thereby effectively eliminating the evaporator for the reverse heat flow system. That patent thus provided a heat pipe system which effectively acted as a heat pipe diode.

U.S. Pat. No. 4,118,756, by L. A. Nelson et al, issued Oct. 3, 1978, proposes a heat pipe thermal mounting plate including a thick artery wick and thin condenser and evaporator wicks for cooling electronic circuit cards.

U.S. Pat. No. 4,212,349, by F. E. Andros et al, issued July 15, 1980 for a Micro Bellows Thermo Capsule. In an effort to eliminate the need for a capillary wick, that patent proposes formation of an internal vapor bubble through which vapor is to flow to a condenser section, and along which condensate is to return to an opposite evaporator section. That vapor bubble arrangement is preferably disposed in a micro bellows capsule to enable absorption of stresses in the system during operation and to provide a metallurgical bond independently of the tolerances of the total system.

A similar arrangement has been disclosed in U.S. Pat. No. 4,313,492, by F. E. Andros et al, issued Feb. 2, 1982 for a Micro Helix Thermo Capsule. According to that patent, a quantity of coolant liquid is disposed in a container comprising a flexible cylindrical bellows having a helical convolution providing a capillary passage between spaced condenser and evaporator sections.

Reference may also be had to U.S. Pat. No. 4,402,358, by D. A. Wolf, issued Sept. 6, 1983, for a Heat Pipe Thermal Switch. That thermal switch includes a flexible bellows defining an expansible vapor chamber for a working fluid located between evaporation and condensation chambers. A coiled retaining spring and several axial wicks are located inside that bellows. The evaporation and condensation chambers are connected by turnbuckles and tension springs to provide a set point adjustment for setting the gap between an interface plate on the condensation chamber and a heat sink for the thermal switching action contemplated by that reference.

Of course, as in the above mentioned Altoz et al U.S. Pat. No. 3,957,107, standoff support members have to be provided between the "hot" and "cold" plates, so as to provide for the initial gap between the interface plate of the thermal switch and the heat sink, which enables the switching action desired in those references, but which transmits vibrations along the standoff members to the load.

None of these references protects the heat transfer cycle in the heat pipe against pressure variations occurring externally of its enclosure. In practice, this may impair the applicability of prior-art proposals to airborne or other systems exposed to pressure variations occurring externally of the heat pipe structure.

SUMMARY OF THE INVENTION

It is a general object of this invention to overcome the disadvantages and to meet the needs expressed or implicit in the above Information Disclosure Statement or in other parts hereof.

It is a germane object of this invention to improve performance of systems for transporting heat-generating loads through an environment affected by vibrations and pressure variations.

It is a related object of this invention to combine heat pipe and vibration isolation systems into a unitary structure carrying heat-generating loads through an environment affected by vibrations, and it is also an object of this invention to protect the heat-transfer cycle in such a unitary structure against pressure variations occurring externally thereof.

It is a related object of this invention to improve the transport of heat-generating loads aboard aircraft and other vehicles proceeding through environments affected by vibrations and pressure variations.

It is also an object of this invention to provide improved heat pipe structures which operate despite pressure variations occurring externally thereof.

Other objects of the invention will become apparent in the further course of this disclosure.

From one aspect thereof, the subject invention resides in methods and apparatus for transporting a heat-generating load through an environment affected by vibrations and pressure variations. The invention according to this aspect resides in the improvement comprising, in combination, the steps of, or means for, providing a working fluid vaporizable by heat from the load, providing a capillary structure for advancing that working fluid, when in a liquid state, from a condenser section at a heat-conducting supporting structure spaced from the load to an evaporator section at a heat-conducting load support at the load, for converting the advanced fluid to a vapor state with heat drawn from the load in that evaporator section, providing between that supporting structure and that load support a flexible enclosure encompassing around the capillary structure at least part of a space extending from the evaporator section back to the condenser section for returning the working fluid, when in its vapor state, in a heat-transfer cycle to the condenser section for reconversion to its liquid state upon removal of heat through the supporting structure and for reapplication of the working fluid in its liquid state through the capillary structure from the condenser section to the evaporator section for reevaporation thereat with more heat drawn from the load, providing resilient means extending between the supporting structure and the load support for effecting vibration damping of the load while removing heat therefrom in the evaporation section with the working fluid converting to its vapor state inside the flexible enclosure, and, protecting that heat-transfer cycle in the flexible enclosure against pressure variations occurring externally of that flexible enclosure.

From a related aspect thereof, the subject invention relates to the same kind of method and apparatus, but resides in the improvement comprising, in combination, the steps of, or means for providing a heat-conducting supporting structure with two spaced surfaces, providing a heat-conducting load support for the load and extending that heat-conducting load support in between the spaced surfaces of the supporting structure and in mutually spaced relationship thereto, providing a working fluid vaporizable by heat from the load, providing at least one capillary structure for advancing the working fluid, when in a liquid state, from at least one condenser section at at least one of the spaced surfaces of the heat-conducting supporting structure to at least one evaporator section at the heat-conducting load support, for converting the advanced fluid to a vapor state with heat drawn from the load in said evaporator section, providing between the spaced surfaces of the supporting structure and the load support flexible enclosures of which at least one encompasses around the capillary structure at least portions of a space extending from said evaporator section back to the condenser section for returning the working fluid, when in the vapor state, in a heat-transfer cycle to the condenser section for reconversion to the liquid state upon removal of heat through the supporting structure and for reapplication of the working fluid in its liquid state through the capillary structure from the condenser section to the evaporator section for reevaporation thereat with more heat drawn from the load, and providing resilient means extending at least partially between the spaced surfaces of the supporting structure and the load support for effecting vibration damping of the load while removing heat therefrom in the evaporator section with the working fluid converting to the vapor state thereat.

BRIEF DESCRIPTION OF THE DRAWINGS

The subject invention and its various aspects and objects will become more readily apparent from the following detailed description of preferred embodiments thereof, illustrated by way of example in the accompanying drawings, in which like reference numerals designate like or functionally equivalent parts, and in which.

DESCRIPTION OF PREFERRED EMBODIMENTS

Figure 1:
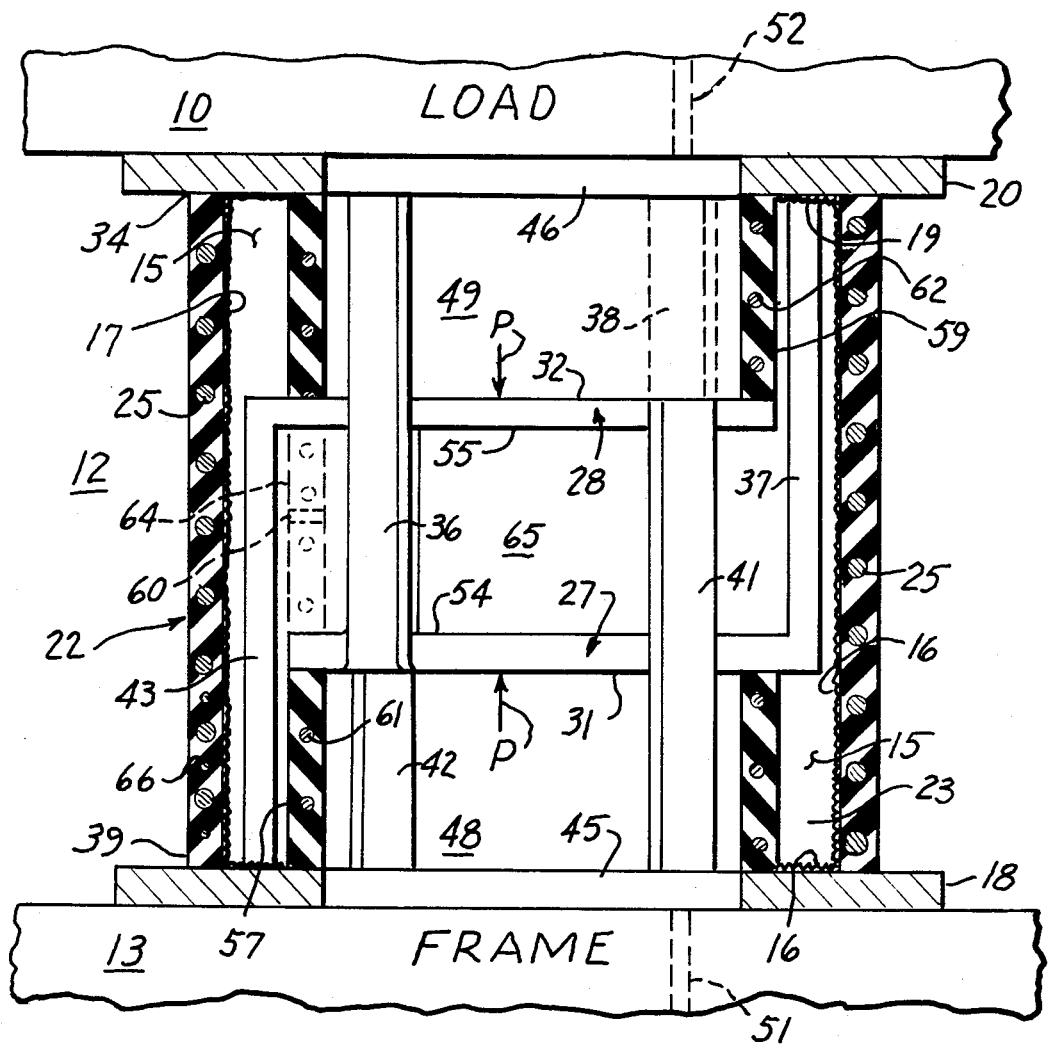
FIG. 1 is an elevation, partially in section, of a pressure variation-compensated, vibration isolating heat sink according to a preferred embodiment of the subject invention.

The subject drawing shows a load 10 being transported through an environment 12 affected by vibrations and pressure variations, such as found aboard aircraft and other vehicles flying at different altitudes or being otherwise subjected to widely different pressures.

By way of example, the load 10 may be transistorized or other electronic equipment or an electromechanical apparatus which is in operation during transport through a vibrational environment. As is well known in such cases, there is a strong need for isolating such apparatus or load 10 from vibrations. There is a similarly strong need for dissipating heat from such apparatus or load. In fact, the performance of such apparatus is strongly dependent on an effective removal of heat therefrom, and the performance of such apparatus invariably suffers if that prevailing requirement can not effectively be met.

However, effective vibration isolators are not effective heat dissipators, since even metals are relatively poor conductors of heat, as the above mentioned SCIENTIFIC AMERICAN article convincingly shows. Conventional heat pipe systems, on the other hand, are poor vibration isolators and their operation is vulnerable to pressure variations as occurring, for instance, in avionics or in similarly variable environments.

The illustrated embodiments of the invention address themselves to these drawbacks and solve these mutually conflicting problems.

The drawings show a structural element 13 labelled FRAME which, indeed, may be part of the frame of an aircraft, known as "air frame." Alternatively, the structural element may be part of the frame of another vehicle or may in fact be another structural part on which the load 10 is to be supported and through which heat can escape.

The illustrated method of transporting the heat-generating load 10 through the environment 12 affected by vibrations and pressure variations, provides a working fluid 15 vaporizable by heat from that load 10. That method also provides a capillary structure 17 for advancing the working fluid, when in a liquid state, from a condenser section 16 at a heat-conducting supporting structure 18 spaced from the load 10 to an evaporator section 19 at a heat conducting load support 20 at the load 10, for converting the advanced fluid to a vapor state with heat drawn from the load in that evaporator section.

In combination with those features, the illustrated method according to an embodiment of the subject invention provides between the supporting structure 18 and the load support 20 a flexible enclosure 22 encompassing around the capillary structure 17 a space 23 extending from the evaporator section 19 back to the condenser section 16 for returning the working fluid 15, when in its vapor state, in a heat-transfer cycle to the condenser section for reconversion to its liquid state upon removal of heat through the supporting structure 18 and for reapplication of that working fluid in its liquid state through the capillary structure 17 from the condenser section 16 to the evaporator section 19 for reevaporation thereat with more heat drawn from the load 10.

Also in combination with the features disclosed so far by reference to FIG. 1, the illustrated method according to a preferred embodiment of the subject invention provides resilient means, such as a coil spring 25, extending between the supporting structure 18 and the load support 20 for effecting vibration damping of the load 10 while removing heat therefrom in the evaporator section 19 with the working fluid 15 converting to the vapor state inside the flexible enclosure 22.

In this respect, the coil spring 25 may effect vibration isolation, while damping may be provided by the flexible enclosure 22; the two terms being used interchangeably and collectively herein.

According to the illustrated preferred embodiment of the invention, the resilient means or coil spring 25 is provided in the flexible enclosure 22 between the supporting structure 18 and the load support 19 for effecting vibration damping of the load 10 while removing heat therefrom in the evaporator section 19 with the working fluid 15 converting to its vapor state inside the resilient load vibration damping means in the flexible enclosure.

According to a preferred embodiment of the invention, the vibration damping resilient means or coil spring 25 is embedded in the flexible enclosure 22. However, within the scope of the invention, the vibration damping means or coil spring may be in the flexible enclosure by being located inside of that flexible enclosure 22. However, the best mode currently contemplated for carrying out the invention provides the resilient vibration damping means 25 integral with the flexible enclosure 22.

The subject invention also protects the heat-transfer cycle in the flexible enclosure 22 against pressure variations occurring externally of the flexible enclosure 22 in the environment 12 affected by vibrations and pressure variations.

In accordance with the best mode currently contemplated for carrying the invention into effect, the heat-transfer cycle is protected against externally occurring pressure variations by compensating such externally occurring pressure variations at or in the flexible enclosure. According to a preferred embodiment of the invention, this is done by making the externally occurring pressure variations bear on opposite ends of the flexible enclosure inversely to how these externally occurring pressure variations bear on such opposite ends through the supporting structure 18 and the load support 20, respectively.

In particular, the illustrated preferred embodiment of the invention provides a pair of auxiliary plates 27 and 28 and makes the externally occurring pressure variations bear on selected surfaces thereof, as indicated by way of example with arrows P.

In particular, the illustrated preferred embodiment of the invention makes the externally occurring pressure variations P bear on only one surface 31 of one of the auxiliary plates 27, in the same manner as they bear on the supporting structure 18. Similarly, the illustrated preferred embodiment of the invention makes the externally occurring pressure variations P bear on only one surface 32 of the other of the auxiliary plates 28 in the same manner as they bear on the load support 20. That one surface 32 of that other of the auxiliary plates is provided on a side of that other of the auxiliary plates 28 which is opposite a side of the one of the auxiliary plates on which the above mentioned one side 31 of that one of the auxiliary plates 27 is provided.

The illustrated preferred embodiment of the invention couples one of the auxiliary plates 27 and one end 34 of the flexible enclosure 22 to the load support 20. For that purpose, the one auxiliary plate 27 may be suspended from the load support 20 by three legs 36, 37 and 38, extending between and attached to both the load support 20 and one auxiliary plate 27.

Similarly, the illustrated preferred embodiment of the invention couples the other auxiliary plate 28 and the opposite end 39 of the flexible enclosure 22 to the supporting structure 18 to compensate the externally occurring pressure variations P relative to that flexible enclosure 22. That other auxiliary plate 28 may be supported on the supporting structure 18 by three legs 41, 42 and 43 which extend between and are attached to the supporting structure 18 and the other auxiliary plate 28.

The auxiliary plates 27 and 28 are exposed to the externally occurring pressure variations P outside the flexible enclosure. Within the scope of the subject invention, this may be done by positioning the auxiliary plates 27 and 28 outside the flexible enclosure, such as between extensions of the supporting structure 18 and load support 20. However, pursuant to the illustrated preferred embodiment of the subject invention, this is accomplished by locating the auxiliary plates 27 and 28 inside the heat pipe structure inside the flexible enclosure 22, and by providing orifices, apertures or openings 45 and 46 in the supporting structure or bottom plate 18 and in the load support or top plate 20, respectively, for an admission of the environmental pressure variations to bottom and top chambers 48 and 49 below and above the auxiliary plate 27 and 28 at surfaces 31 and 32, respectively.

In principle, it is assumed that neither the frame 13, nor the load 10 will seal the openings 45 and 46 hermetically against the environment 12. However, in cases where there should be any such danger, one or more orifices 51 may be provided in the frame 13 while one or more orifices 52 may be present in the load 10.

Surfaces 54 and 55 of the auxiliary plates 27 and 28 opposite the one surfaces 31 and 32 are shielded against the externally occurring pressure variations P. In principle this could be done by providing an auxiliary flexible enclosure between the plates 27 and 28.

However, according to the illustrated preferred embodiment of the subject invention, the chamber 48 is encompassed by a first auxiliary flexible enclosure 57 which extends between the supporting structure 18 and auxiliary plate 27 so as to seal the inside of the heat pipe and the space between the plates 27 and 28 against the environment 12, opening 45 and chamber 48.

Similarly, a second auxiliary flexible enclosure 59 extends between the load support 20 and second auxiliary plate 28 so as to seal the heat pipe and the space 65 against top opening 46, chamber 49 and environment 12.

The auxiliary flexible enclosures 57 and 59 may be made of the same material as the principal flexible enclosure 22. The auxiliary flexible enclosures 57 and 59 may be reinforced by coiled wires 61 and 62 embedded therein.

The effective area of each of the surfaces 31 and 32 preferably is equal to the surface of each of the annuli of the supporting structure and load support or plates 18 and 20 between the outer and inner flexible enclosures 22 and 57 or 58 or, in this case, around the openings 45 and 46. By way of example, each of the surfaces 31 and 32 may have an effective diameter which is equal to the square root of one-half, or approximately 0.7, the diameter of the flexible enclosure 22, so that each inner enclosure 57 and 59 has the same cross section as the annulus surrounding same between the outer and inner flexible enclosures 22 and 57 or 59.

In this manner, the combined heatpipe and vibration damping structure according to the illustrated preferred embodiment of the invention will perform well at all kind of altitudes and at all kind of pressure variations. The load 10 is thus not only protected against vibration, but also against over-heating during use and transport.

As shown in dotted outline at 64, a bellows or flexible enclosure may be provided between the auxiliary plates 27 and 28. In practice, such an auxiliary bellows 64 would, of course, encompass the space 65 between the plates 27 and 28, even though shown on only one side of the space 65 in FIG. 1. For viscous damping, an aperture 60 may be provided in the bellows 64.

From another aspect thereof, the illustrated preferred embodiment of the invention provides a pair of auxiliary plates 27 and 28 spaced from each other inside the flexible enclosure 22. One of the auxiliary plates, such as the plate 28, is positioned closer to the load support 20 than the other of the auxiliary plates, such as the plate 27, and that one auxiliary plate 28 is coupled to the supporting structure 18, such as via legs 41 to 43. The other auxiliary plate 27 is positioned between the one auxiliary plate 28 and the supporting structure 18, and that other auxiliary plate 27 is coupled to the load support 20, such as via legs 36 to 38.

Pressure variations are made to bear on a surface 32 of that one auxiliary plate 28 facing the load support 20. Conversely, pressure variations are made to bear on a surface 31 of the other auxiliary plate 27 facing the supporting structure 18.

The auxiliary plate surfaces 31 and 32 are shielded against a remainder of the inside of the flexible enclosure 22, such as by means of auxiliary flexible enclosures or bellows 57 and 59. The space 65 between the spaced auxiliary plates 27 and 28 may be sealed by a further flexible auxiliary enclosure or bellows 64 against a further remainder of the inside of the flexible enclosure 22, except for an aperture 60.

That flexible enclosure 22 may be reinforced between turns of the coil spring 25. In this respect, the resilient vibration damping means may be provided as a first coil spring 25 extending between the supporting structure 18 and the load support 20 and being embedded in that flexible enclosure 22, which may be reinforced with a second coil spring, part of which is seen at 66. That second coil spring, if employed, is weaker than the first coil spring 25 and is embedded in the flexible enclosure 22 by having turns of that second coil spring 66 interdigitated with turns of the first coil spring 25.

In addition or alternatively, an embodiment of the subject invention makes the flexible enclosure of an elastomer reinforced by a fabric 71 resisting circumferential expansion of that flexible enclosure.

Figure 2:
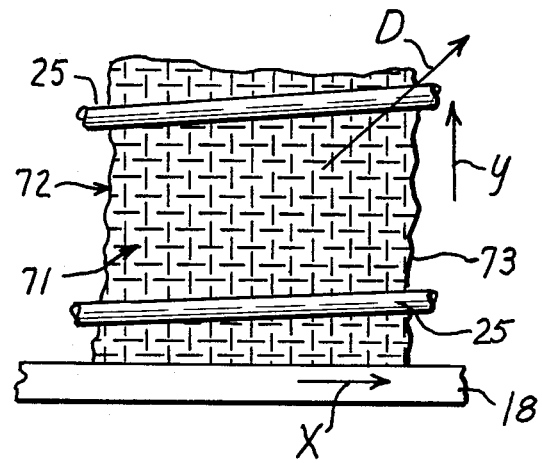
FIG. 2 is a detail view of a reinforced flexible enclosure according to another embodiment of the invention usable in the structures of FIGS. 1, 3 and 4.

By way of example, FIG. 2 shows part of a flexible enclosure 72 which may be employed in lieu of the flexible enclosure 22. Apart from the fabric 71, the flexible enclosure 72 may in every respect be the same and have the same function as, the flexible enclosure 22 shown, for example, in FIG. 1. Even though only the supporting structure or plate 18 is shown in FIG. 2, it is understood that the other parts and components shown, for example in FIG. 1, may also be employed in the embodiment of FIG. 2, for supporting and cooling a load 10 relative to a frame or other heat sink support structure 13.

FIG. 2 shows the fabric 71 on the outside of the elastomer enclosure 73. However, the fabric may be embedded in the flexible enclosure 22 or 72, even though it would then no longer be visible as in FIG. 2.

Because of the need to have the spring 25 equally yieldable in all three principal axes, the fabric must be a loose weave. The loosely woven fabric shown in FIG. 2 is resistant to stretch in the x and y directions, since the woof and the warp extend in these directions, respectively. However, the fabric 71 can be elongated in the D direction as the squares in that weave become rhombic in shape. The stiffness in the x direction precludes the envelope of elastomer film from expanding in diameter. The y stiffness is effective only in elongation but is amenable to compression by folding when the load is applied on the spring. Also, if required, the fabric in the elastomer may be installed with a y direction compliancy in elongation by pre-forming folds. This leaves the effect of atmospheric pressure on the ends of the enclosed area of spring and enclosing elastomer film 73. For instance, if the end area is four square inches and a change of 10 psi in atmospheric pressure is experienced, the change in spring load is 40 pounds.

This can likely be more than the design load of the spring 25. In that case, a pressure variation compensation system, such as that shown in FIG. 1, may be employed for protecting the heat-transfer cycle in the flexible enclosure 72 against pressure variations occurring externally of that flexible enclosure.

Figure 3:
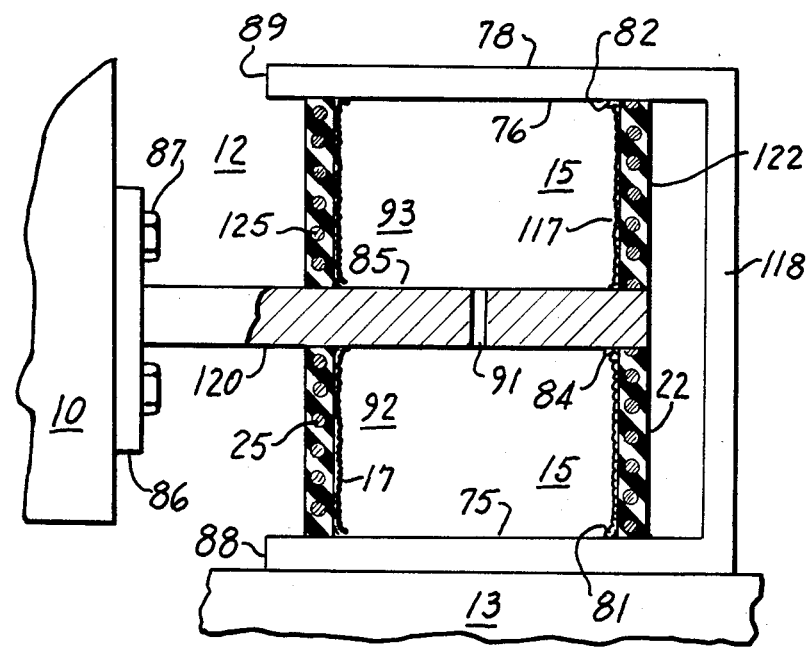
FIG. 3 is a view similar to FIG. 1, of a further embodiment of the invention.
Figure 4:
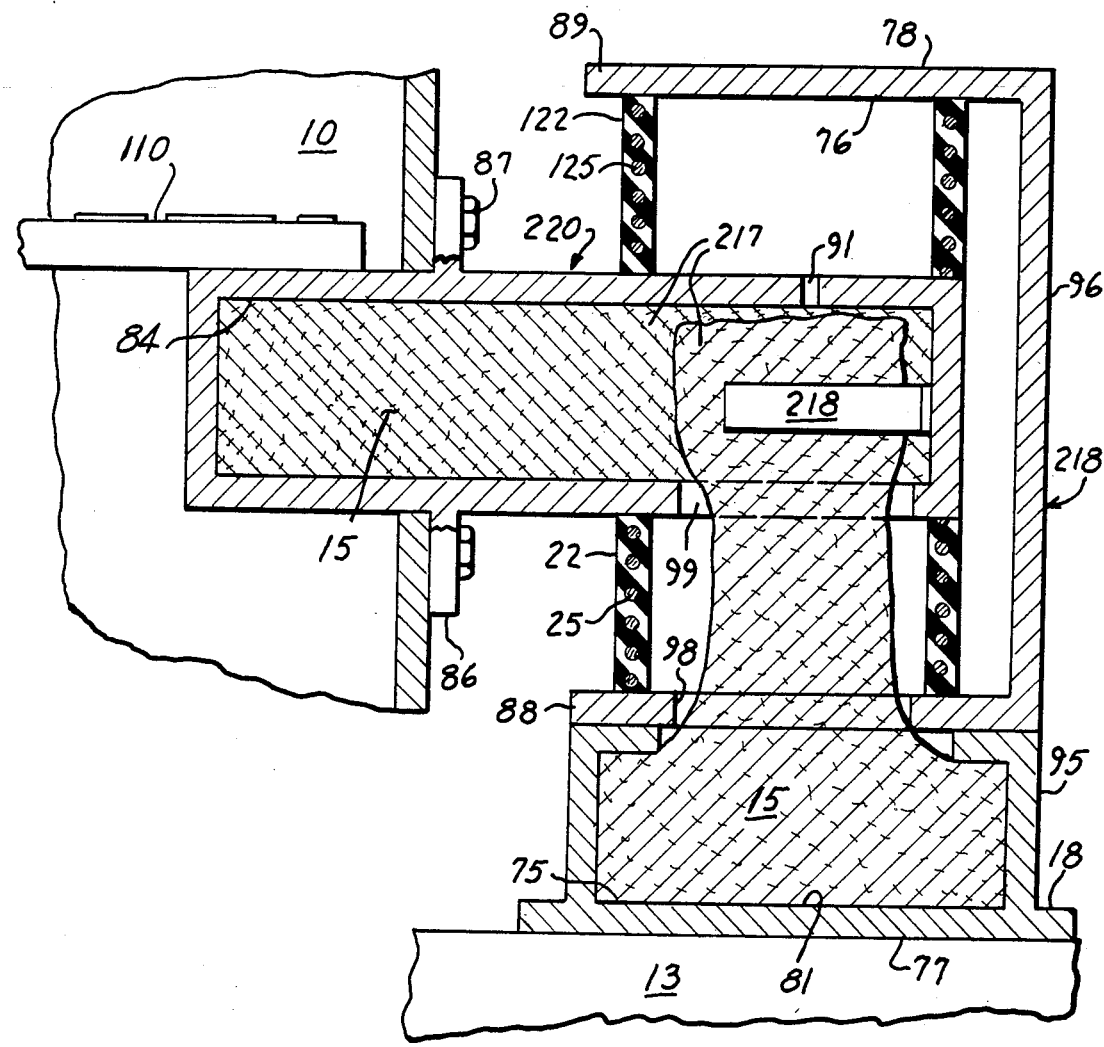
FIG. 4 is a view similar to FIG. 1, showing yet another embodiment of the invention.

The same applies in principle to the embodiments of FIGS. 3 and 4. However, these embodiments have a built-in protection against pressure variations occurring in the atmosphere 12 around the heat pipe and vibration isolation structure.

The vibration isolation and cooling systems shown in FIGS. 1 to 4 embody a generic concept of the invention, which manifests itself in various species, of which three are specifically shown in FIGS. 1, 3 and 4, with FIG. 2 showing an improvement within the scope of the invention applicable to any species.

One distinguishing feature of the species of FIGS. 3 and 4 is that the heat-conductive supporting structure is extended to opposite sides of the load support. In FIG. 3, the heat-conducting supporting structure 118 is an extension of the supporting structure 18 shown in FIG. 1. Similarly, the heat-conducting supporting structure 218 shown in FIG. 4 is an extension of the supporting structure 18 of FIG. 1 or even of the supporting structure 118 of FIG. 3.

The load supports of the embodiments of FIGS. 3 and 4 correspond to the load support 20 of FIG. 1. Both load supports 120 and 220 laterally extend out of the essentially vertical damping and cooling structure, as seen in FIGS. 3 and 4.

The embodiments of FIGS. 3 and 4 provide the heat-conducting supporting structures 118 and 218 with spaced surfaces 75 and 76 and 77 and 78. Each embodiment of FIGS. 3 and 4 also provides a heat-conducting load support 120 or 220 for the load 10 and extends that heat-conducting load support in between the spaced surfaces 75 and 76 or 77 and 78 of the supporting structure 118 or 218, and in mutually spaced relationship thereto.

All embodiments also provide, include or contain a working fluid 15 vaporizable by heat from the load 10. All embodiments also provide or include at least one capillary structure for advancing that working fluid, when in its liquid state, from at least one condenser section at at least one of the spaced surfaces 75 and 76 of the heat-conducting supporting structure 118 or 218 to at least one evaporator section at the heat-conducting load support 120 or 220, for converting that advanced fluid to a vapor state with heat drawn from the load in the evaporator section.

The embodiments of FIGS. 3 and 4 also provide between the spaced surfaces 75 and 76 or 77 and 78 of the supporting structure 118 or 218 and the load support 120 or 220 flexible enclosures 22 and 122 of which at least one encompasses around the capillary structure or structures at least portions of a space or spaces extending from the evaporator section back to the condenser section or sections for returning the working fluid 15, when in its vapor state, in a heat-transfer cycle to the condenser section or sections for reconversion to its liquid state upon removal of heat through the supporting structure 118 or 218 and for reapplication of that working fluid in its liquid state through the capillary structure or structures from the condenser section or sections to the evaporator section or sections for re-evaporation thereat with more heat drawn from the load.

The embodiments of FIGS. 3 and 4 also provide resilient means or coil springs 25 and 125 extending at least partially between the spaced surfaces 75 and 76 or 77 and 78 of the supporting structure 118 or 218 and the load support 120 or 220 for effecting vibration isolation of the load 10 while removing heat therefrom in such evaporator section or sections with the working fluid converting to its vapor state thereat.

As already indicated above, a protection of the heat transfer cycle in the flexible enclosure or enclosures against pressure variations P occurring externally of such flexible enclosure 22 or enclosures 22 and 122 is inherent in the system and structure of the embodiments of FIGS. 3 and 4.

It will be noted in this respect that each heat-conducting supporting structure 118 and 218 is in the form of or includes a C-shaped clamp which contains the flexible enclosure and damping means 22, 25, 122 and 125, as well as the suspended and movable load support at least partially therebetween.

According to the embodiment of the invention shown in FIG. 3, two capillary structures 17 and 117 are provided for advancing the working fluid 15, when in its liquid state, from condenser sections 81 and 82 at the spaced surfaces 75 and 76 of the heat-conducting supporting structure 118, to evaporator sections 84 and 85 at the heat-conducting load support 120, for converting the advanced working fluid to a vapor state with heat drawn from the load 10 through a heat-conducting flange 86 to which the load 10 may be attached by one or more fasteners 87, to mention just one of many possible examples of load support and attachment.

In practice, the load 10 may be supported by or between two or more of the vibration damping and heat sink structures shown in any of the drawings. A mixture of these embodiments for the same load may also be employed in practical applications.

In the embodiment of FIG. 3, the flexible enclosures 22 and 122 are provided around the capillary structures 17 and 117 and, in this particular case, from either side of the load support 120 to either surface 75 and 76 or leg 88 and 89 of the C-shaped supporting structure 118, which rests on the frame 13 for a continuous removal of heat therefrom.

The illustrated preferred embodiment of FIG. 3 provides an orifice 91 between the evaporator sections 84 and 85. This enables viscous damping between the opposed heat pipe structures 92 and 93.

The embodiment shown in FIG. 3 also manifests a broader concept within the scope of the subject invention, according to which two vibration damping and heat pipe structures 92 and 93 are arranged for operation in a push-pull fashion for supporting and cooling a heat-generating load in an environment 12 affected by vibrations and pressure variations.

Where the load 10 includes a specific internal heat source, such as a circuit board 110, an embodiment of the subject invention, such as the one shown in FIG. 4, expands the load support 220 into that load so that the evaporator section 84 is located at that internal heat source to draw heat therefrom by conversion of the advanced working fluid 15 to its vapor state. The capillary structure 217, which corresponds to the capillary structure 17 of FIGS. 1 and 3, extends from the condenser section 81 through the expanded load support 220 to the evaporator section 84 at the internal heat source 110 in the load 10.

In the embodiment illustrated in FIG. 4, the supporting structure 218 has a base plate 18 which, like its counterpart in FIG. 1, is in heat-transfer relationship with the heat sink or frame 13. The structure 218 also has a rigid heat-conducting hollow base portion 95 for supporting the essentially C-shaped support 96 carrying the flexible enclosures 22 and 122, the damping means or coils 25 and 125 and the load support 220 between the legs 88 and 89 thereof. Within the scope of the subject invention, the flexible support 22 could extend all the way down to the base plate 18 or evaporator section 81. In that case, the evaporator section 81 most likely would be located inside the lower leg 88 of the support structure 96, which would then take the place of the base plate 18, as does the lower leg 88 in the embodiment of FIG. 3.

In the embodiment shown in FIG. 4, the assembly 96 including the flexible enclosures 22 and 122 and vibration damping means or coils 25 and 125 and the load support 220 are supported with a rigid heat-conducting hollow base structure 95, and the condenser section 81 is located in that base structure, at the base plate 18 in proximity to the heat sink or frame 13.

The capillary structure 217, which may be a hollow woven wick, is extended from the condenser section 81 through the hollow base structure 95, and opening 98 in the lower leg 88 of the support structure 96, the lower flexible enclosure 22, and opening 99 in the load support 220 and through that expanded load support to the evaporator section 84 at the internal heat source 110 in the load 10. The working fluid 15 will thus move in this direction from the condenser section 81 to the evaporator section 84, where it will convert to its vapor state by heat drawn from the heat source 110. That vapor, in turn, will descend via the hollow wick 217 in the reverse direction through the load support, opening 99, flexible enclosure 22, opening 98 and base structure 95 to the condenser section 81 for recondensation thereat upon withdrawal of heat through the frame 13.

The capillary structure may be in one piece or, as shown for the wick 217 in FIG. 4, may, for instance, be composed of two pieces, held together by interconnecting means, shown as a clip 218.

An opening similar to the opening 99 could also be provided in the top of the load support 220 within the perimeter of the upper flexible support 122. However, FIG. 4 rather shows an orifice 91 for viscous damping purposes.

Suitable working fluids 15 include methyl alcohol, water, freon, and other vaporizable fluids, including those mentioned in the references set forth above and herewith incorporated by reference herein for their disclosures and teachings.

Suitable elastomers for the flexible enclosures 22, 57, 59 and 122 include neoprene, silicone rubber and fluoroelastomer, with the latter two being preferred over neoprene because of better temperature characteristics.

The subject extensive disclosure will render apparent or suggest to those skilled in the art various modifications and variations within the spirit and scope of the subject invention and equivalents thereof.

I claim:

1. In a method of transporting a heat-generating load through an environment affected by vibrations and pressure variations, the improvement comprising in combination the steps of:
providing a working fluid vaporizable by heat from the load;
providing a capillary structure for advancing said working fluid, when in a liquid state, from a condenser section at a heat-conducting supporting structure spaced from said load to an evaporator section at a heat-conducting load support at said load, for converting the advanced fluid to a vapor state with heat drawn from said load in said evaporator section;
providing between said supporting structure and said load support a flexible enclosure encompassing around said capillary structure at least part of a space extending from said evaporator section back to said condenser section for returning said working fluid, when in said vapor state, in a heat-transfer cycle to said condenser section for reconversion to said liquid state upon removal of heat through said supporting structure and for reapplication of said working fluid in said liquid state through said capillary structure from said condenser section to said evaporator section for reevaporation thereat with more heat drawn from said load;
providing resilient means extending between said supporting structure and said load support for effecting vibration damping of said load while removing heat therefrom in said evaporator section with said working fluid converting to said vapor state inside said flexible enclosure; and
protecting said heat-transfer cycle in said flexible enclosure against pressure variations occurring externally of said flexible enclosure.

2. A method as claimed in claim 1, including the steps of:
providing said resilient means in said flexible enclosure between said supporting structure and said load support for effecting vibration damping of said load while removing heat therefrom in said evaporation section with said working fluid converting to said vapor state inside said resilient load vibration damping means in said flexible enclosure.

3. A method as claimed in claim 1, wherein:
said heat-transfer cycle is protected against said externally occurring pressure variations by compensating said externally occurring pressure variations at said flexible enclosure.

4. A method as claimed in claim 1, including the step of:
making said externally occurring pressure variations bear on opposite ends of said flexible enclosure inversely to how these externally occurring pressure variations bear on said opposite ends through said supporting structure and said load support, respectively.

5. A method as claimed in claim 4, including the steps of:
providing said resilient means in said flexible enclosure between said supporting structure and said load support for effecting vibration damping of said load while removing heat therefrom in said evaporation section with said working fluid converting to said vapor state inside said resilient load vibration damping means in said flexible enclosure.

6. A method as claimed in claim 1, including the steps of:
providing a pair of auxiliary plates;
making said externally occurring pressure variations bear on only one surface of one of said auxiliary plates in the same manner as they bear on said supporting structure;
coupling said one of the auxiliary plates and one end of said flexible enclosure to said load support;
making said externally occurring pressure variations bear on only one surface of the other of said auxiliary plates in the same manner as they bear on said load support, with said one surface of said other of the auxiliary plates being provided on a side of said other of the auxiliary plates opposite a side of said one of the auxiliary plates on which said one side of said one of the auxiliary plates is provided; and
coupling said other of the auxiliary plates and an opposite end of said flexible enclosures to said supporting structure to compensate said externally occurring pressure variations relative to said flexible enclosure.

7. A method as claimed in claim 6, wherein:
said auxiliary plates are exposed to said externally occurring pressure variations outside said flexible enclosure.

8. A method as claimed in claim 7, including the step of:
shielding surfaces of said auxiliary plates opposite said one surfaces against said externally occurring pressure variations.

9. A method as claimed in claim 7, including the steps of:
providing between said auxiliary plates a bellows; and
moving an aperture in the latter bellows for viscous damping.

10. A method as claimed in claim 1, including the steps of:
providing a pair of auxiliary plates spaced from each other inside said flexible enclosure;
positioning one of said auxiliary plates closer to said load support than the other of said auxiliary plates and coupling said one of the auxiliary plates to said supporting structure;
positioning said other of the auxiliary plates between said one of the auxiliary plates and said supporting structure and coupling said other of the auxiliary plates to said load support;
making said pressure variations bear on a surface of said one of the auxiliary plates facing said load support; and
making said pressure variations bear on a surface of said other of the auxiliary plates facing said supporting structure.

11. A method as claimed in claim 10, including the step of:
shielding said surfaces of the auxiliary plates against a remainder of the inside of said flexible enclosure.

12. A method as claimed in claim 11, including the step of:
shielding a space between said spaced auxiliary plates against a further remainder of the inside of said flexible enclosure.

13. A method as claimed in claim 1, wherein:
said load includes an internal heat source; and
said load support is expanded into said load so that said evaporator section is located at said internal heat source to draw heat therefrom by conversion of said advanced fluid to its vapor state.

14. A method as claimed in claim 1, wherein:
said heat-conducting supporting structure is extended to opposite sides of said load support.

15. A method as claimed in claim 1, including the step of:
providing said resilient means integral with said flexible enclosure.

16. A method as claimed in claim 1, including the step of:
providing said resilient means as a coil spring extending between said supporting structure and said load support and being embedded in said flexible enclosure.

17. A method as claimed in claim 16, including the step of:
reinforcing said flexible enclosure between turns of said coil spring.

18. A method as claimed in claim 1, including the steps of:
providing said resilient means as a first coil spring extending between said supporting structure and said load support and being embedded in said flexible enclosure; and
reinforcing said flexible enclosure with a second coil spring being weaker than said first coil spring, and being embedded in said flexible enclosure by having turns of said second coil spring interdigitated with turns of said first coil spring.

19. A method as claimed in claim 1, including the step of:
making said flexible enclosure of an elastomer reinforced by a fabric resisting circumferential expansion of said flexible enclosure.

20. In a method of transporting a heat-generating load through an environment affected by vibrations and pressure variations,
the improvement comprising in combination the steps of:
providing a heat-conducting supporting structure with two spaced surfaces;
providing a heat-conducting load support for said load and extending said heat-conducting load support in between said spaced surfaces of the supporting structure and in mutually spaced relationship thereto;
providing a working fluid vaporizable by heat from the load;
providing at least one capillary structure for advancing said working fluid, when in a liquid state, from at least one condenser section at at least one of said spaced surfaces of the heat-conducting supporting structure to at least one evaporator section at said heat-conducting load support, for converting the advanced fluid to a vapor state with heat drawn from said load in said evaporator section;
providing between said spaced surfaces of the supporting structure and said load support flexible enclosures of which at least one encompasses around said capillary structure at least a portion of a space extending from said evaporator section back to said condenser section for returning said working fluid, when in said vapor state, in a heat-transfer cycle to said condenser section for reconversion to said liquid state upon removal of heat through said supporting structure and for reapplication of said working fluid in said liquid state through said capillary structure from said condenser section to said evaporator section for reevaporation thereat with more heat drawn from said load; and providing resilient means extending at least partially between said spaced surfaces of the supporting structure and said load support for effecting vibration damping of said load while removing heat therefrom in said evaporator section with said working fluid converting to said vapor state thereat.

21. A method as claimed in claim 20, including the steps of:

providing capillary structures for advancing the working fluid, when in its liquid state, from condenser sections at said spaced surfaces of the heat-conducting supporting structure to evaporator sections at the heat-conducting load support, for converting the advanced working fluid to a vapor state with heat drawn from the load; and providing said flexible enclosures around said capillary structures.

22. A method as claimed in claim 20, including the step of:

providing an orifice between said flexible enclosures.

23. A method as claimed in claim 20, wherein:
said load includes an internal heat source; and
said load support is expanded into said load so that said evaporator section is located at said internal heat source to draw heat therefrom by conversion of said advanced fluid to its vapor state.

24. A method as claimed in claim 23, wherein:
said capillary structure extends from the condenser section through the expanded load support to said evaporator section at said internal heat source in the load.

25. A method as claimed in claim 23, including the steps of:

supporting said flexible enclosures with a rigid heat-conducting hollow base structure;

locating said condenser section in said base structure; and extending said capillary structure from said condenser section through said hollow base structure, said one flexible enclosure and said expanded load support to said evaporator section at said internal heat source in the load.

26. In apparatus for transporting a heat-generating load through an environment affected by vibrations and pressure variations,
the improvement comprising in combination:

a working fluid vaporizable by heat from the load;

a capillary structure for advancing said working fluid, when in a liquid state, from a condenser section at a heat-conducting supporting structure spaced from said load to an evaporator section at a heat-conducting load support at said load, for converting the advanced fluid to a vapor state with heat drawn from said load in said evaporator section;

a flexible enclosure located between said supporting structure and said load support encompassing around said capillary structure at least part of a space extending from said evaporator section back to said condenser section for returning said working fluid, when in said vapor state, in a heat-transfer cycle to said condenser section for reconversion to said liquid state upon removal of heat through said supporting structure and for reapplication of said working fluid in said liquid state through said capillary structure from said condenser section to said evaporator section for reevaporation thereat with more heat drawn from said load;

resilient means extending between said supporting structure and said load support for effecting vibration damping of said load while said working fluid converting to said vapor state removes heat from said load; and means for protecting the heat-transfer cycle in said flexible enclosure against pressure variations occurring externally of said flexible enclosure.

27. Apparatus as claimed in claim 26, wherein:
said resilient means are in said flexible enclosure between said supporting structure and said load support for effecting vibration damping of said load; and said heat-transfer cycle takes place in said flexible enclosure.

28. Apparatus as claimed in claim 26, wherein:
said means for protecting said heat-transfer cycle include means for compensating said externally occurring pressure variations at said flexible enclosure.

29. Apparatus as claimed in claim 26, wherein:
said means for protecting said heat-transfer cycle include means for causing said externally occurring pressure variations to bear on opposite ends of said flexible enclosure inversely to how these externally occurring pressure variations bear on said opposite ends through said supporting structure and said load support, respectively.

30. Apparatus as claimed in claim 29, wherein:
said resilient means are in said flexible enclosure between said supporting structure and said load support for effecting vibration damping of said load; and said heat-transfer cycle takes place in said flexible enclosure.

31. Apparatus as claimed in claim 26, wherein:
said means for protecting said heat-transfer cycle include a pair of auxiliary plates, means for causing said externally occurring pressure variations to bear on only one surface of one of said auxiliary plates in the same manner as they bear on said supporting structure, means for coupling said one of the auxiliary plates and one end of said flexible enclosure to said load support, means for causing said externally occurring pressure variations to bear on only one surface of the other of said auxiliary plates in the same manner as they bear on said load support, with said one surface of said other of the auxiliary plates being located on a side of said other of the auxiliary plates opposite a side of said one of the auxiliary plates on which said one side of said one of the auxiliary plates is located, and means for coupling said other of the auxiliary plates and an opposite end of said flexible enclosures to said supporting structure to compensate said externally occurring pressure variations relative to said flexible enclosure.

32. Apparatus as claimed in claim 31, including:
means for exposing said auxiliary plates to said externally occurring pressure variations outside said flexible enclosure.

33. Apparatus as claimed in claim 32, including:
means for shielding surfaces of said auxiliary plates opposite said one surfaces against said externally occurring pressure variations.

34. Apparatus as claimed in claim 32, including:
a bellows between said auxiliary plates; and
an aperture in the latter bellows for viscous damping.

35. Apparatus as claimed in claim 26, wherein:
said means for protecting said heat-transfer cycle include a pair of auxiliary plates spaced from each other inside said flexible enclosure with one of said auxiliary plates being closer to said load support than the other of said auxiliary plates, and said other of the auxiliary plates between said one of the auxiliary plates and said supporting structure, and means for coupling said one of the auxiliary plates to said supporting structure, and for coupling said other of the auxiliary plates to said load support.

36. Apparatus as claimed in claim 35, including:
means for shielding said surfaces of the auxiliary plates against a remainder of the inside of said flexible enclosure.

37. Apparatus as claimed in claim 36, including the:
means for shielding a space between said spaced auxiliary plates against a further remainder of the inside of said flexible enclosure.

38. Apparatus as claimed in claim 26, wherein:
said load includes an internal heat source; and
said load support extends into said load so that said evaporator section is located at said internal heat source to draw heat therefrom by conversion of said advanced fluid to its vapor state.

39. Apparatus as claimed in claim 26, wherein:
said heat-conducting supporting structure extends to opposite sides of said load support.

40. Apparatus as claimed in claim 26, wherein:
said resilient means are integral with said flexible enclosure.

41. Apparatus as claimed in claim 26, wherein:
said resilient means include a coil spring extending between said supporting structure and said load support and being embedded in said flexible enclosure.

42. Apparatus as claimed in claim 41, including:
means for reinforcing said flexible enclosure between turns of said coil spring.

43. Apparatus as claimed in claim 26, wherein:
said resilient means include a first coil spring extending between said supporting structure and said load support and being embedded in said flexible enclosure; and
said apparatus includes means for reinforcing said flexible enclosure, including a second coil spring being weaker than said first coil spring, and being embedded in said flexible enclosure, with turns of said second coil spring being interdigitated with turns of said first coil spring.

44. Apparatus as claimed in claim 26, wherein:
said flexible enclosure includes an elastomer reinforced by a fabric resisting circumferential expansion of said flexible enclosure.

45. In apparatus for transporting a heat-generating load through an environment affected by vibrations and pressure variations,
the improvement comprising in combination:
a heat-conducting supporting structure with two spaced surfaces;
a heat-conducting load support for said load extending in between said spaced surfaces of the supporting structure and in mutually spaced relationship thereto;
a working fluid vaporizable by heat from the load;
at least one capillary structure for advancing said working fluid, when in a liquid state, from at least one condenser section at at least one of said spaced surfaces of the heat-conducting supporting structure to at least one evaporator section at said heat-conducting load support, for converting the advanced fluid to a vapor state with heat drawn from said load in said evaporator section;
flexible enclosures between said spaced surfaces of the supporting structure and said load support, at least one of said flexible enclosures encompassing around said capillary structure at least a portion of a space extending from said evaporator section back to said condenser section for returning said working fluid, when in said vapor state, in a heat-transfer cycle to said condenser section for reconversion to said liquid state upon removal of heat through said supporting structure and for reapplication of said working fluid in said liquid state through said capillary structure from said condenser section to said evaporator section for reevaporation thereat with more heat drawn from said load; and
resilient means extending at least partially between said spaced surfaces of the supporting structure and said load support for effecting vibration damping of said load while said working fluid removes heat therefrom in said evaporator section.

46. Apparatus as claimed in claim 45, including:
two of said capillary structures for advancing the working fluid, when in its liquid state, from condenser sections at said spaced surfaces of the heat-conducting supporting structure to evaporator sections at the heat-conducting load support, for converting the advanced working fluid to a vapor state with heat drawn from the load;
said flexible enclosures extending around said capillary structures.

47. Apparatus as claimed in claim 45, including:
an orifice between said flexible enclosures.

48. Apparatus as claimed in claim 45, wherein:
said load includes an internal heat source; and
said load support extends into said load so that said evaporator section is located at said internal heat source to draw heat therefrom by conversion of said advanced fluid to its vapor state.

49. Apparatus as claimed in claim 48, wherein:
said capillary structure extends from the condenser section through the expanded load support to said evaporator section at said internal heat source in the load.

50. Apparatus as claimed in claim 48, including:
a rigid heat-conducting hollow base structure for supporting said flexible enclosures, with said condenser section being in said base structure;
said capillary structure extending from said condenser section through said hollow base structure, said one flexible enclosure and said expanded load support to said evaporator section at said internal heat source in the load.

* * * * *